US012651110B1

(12) United States Patent
Posser et al.

(10) Patent No.: US 12,651,110 B1
(45) Date of Patent: Jun. 9, 2026

(54) GRID CELL ROUTING CAPACITY ADJUSTMENT FOR DETECTED REGIONS

(71) Applicant: Cadence Design Systems, Inc., San Jose, CA (US)

(72) Inventors: Gracieli Posser, Austin, TX (US); Wing-Kai Chow, Austin, TX (US); Mateus Paiva Fogaça, Porto Alegre (BR); Mehmet Can Yildiz, Austin, TX (US); Charles Jay Alpert, Cedar Park, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 878 days.

(21) Appl. No.: 17/986,740

(22) Filed: Nov. 14, 2022

(51) Int. Cl.
G06F 30/394 (2020.01)

(52) U.S. Cl.
CPC .................................. G06F 30/394 (2020.01)

(58) Field of Classification Search
USPC ......................................... 716/126
See application file for complete search history.

(56) References Cited

U.S. PATENT DOCUMENTS

| | | | | |
|---|---|---|---|---|
| 2012/0192135 A1* | 7/2012 | Gullette | ................ | G06F 30/398 |
| | | | | 716/113 |
| 2012/0272203 A1* | 10/2012 | Hawk | ................... | G06F 30/394 |
| | | | | 716/130 |
| 2017/0199955 A1* | 7/2017 | Won | ...................... | G06F 30/394 |
| 2023/0237236 A1* | 7/2023 | Kim | ...................... | G06F 30/392 |
| | | | | 716/100 |

* cited by examiner

*Primary Examiner* — Mohammed Alam
(74) *Attorney, Agent, or Firm* — Schwegman Lundberg & Woessner, P.A.

(57) ABSTRACT

Various embodiments provide for adjusting routing capacity of a grid cell of one or more layers of a circuit design based on detected regions, such as notch regions (e.g., corners of macros, blockage corners) and input/output (IO) pin regions. More particularly, various embodiments detect one or more notch regions in a circuit design, detect one or more I/O pin regions in the circuit design, and adjust (e.g., reduce) routing capacity of one or more grid cells of one or more detected regions.

20 Claims, 9 Drawing Sheets

200
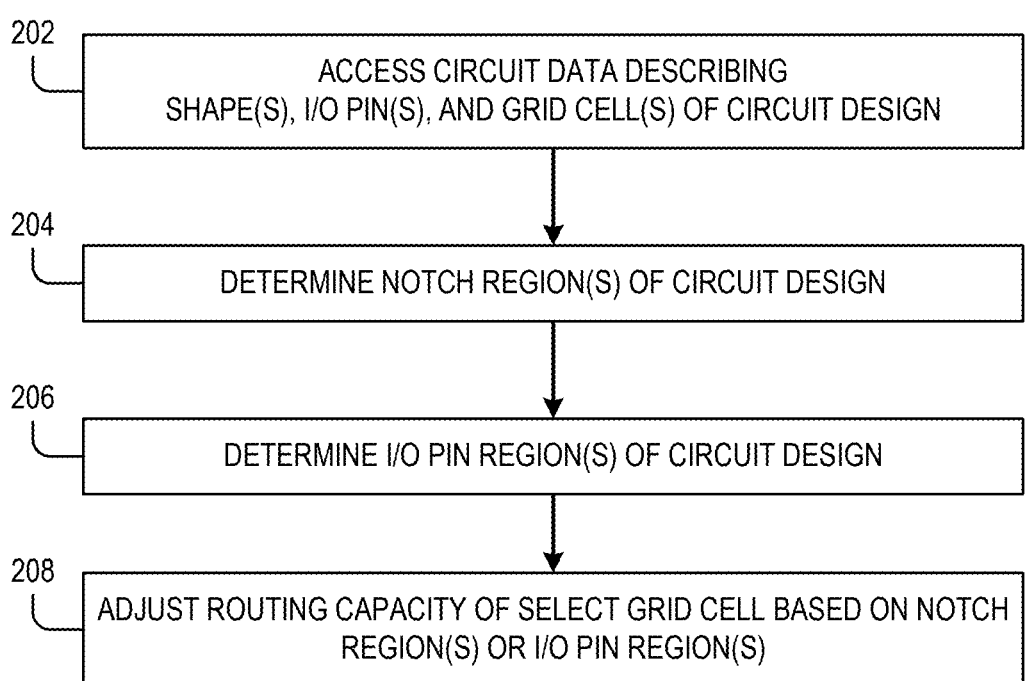
202 — ACCESS CIRCUIT DATA DESCRIBING
SHAPE(S), I/O PIN(S), AND GRID CELL(S) OF CIRCUIT DESIGN
204 — DETERMINE NOTCH REGION(S) OF CIRCUIT DESIGN
206 — DETERMINE I/O PIN REGION(S) OF CIRCUIT DESIGN
208 — ADJUST ROUTING CAPACITY OF SELECT GRID CELL BASED ON NOTCH
REGION(S) OR I/O PIN REGION(S)
*FIG. 2*

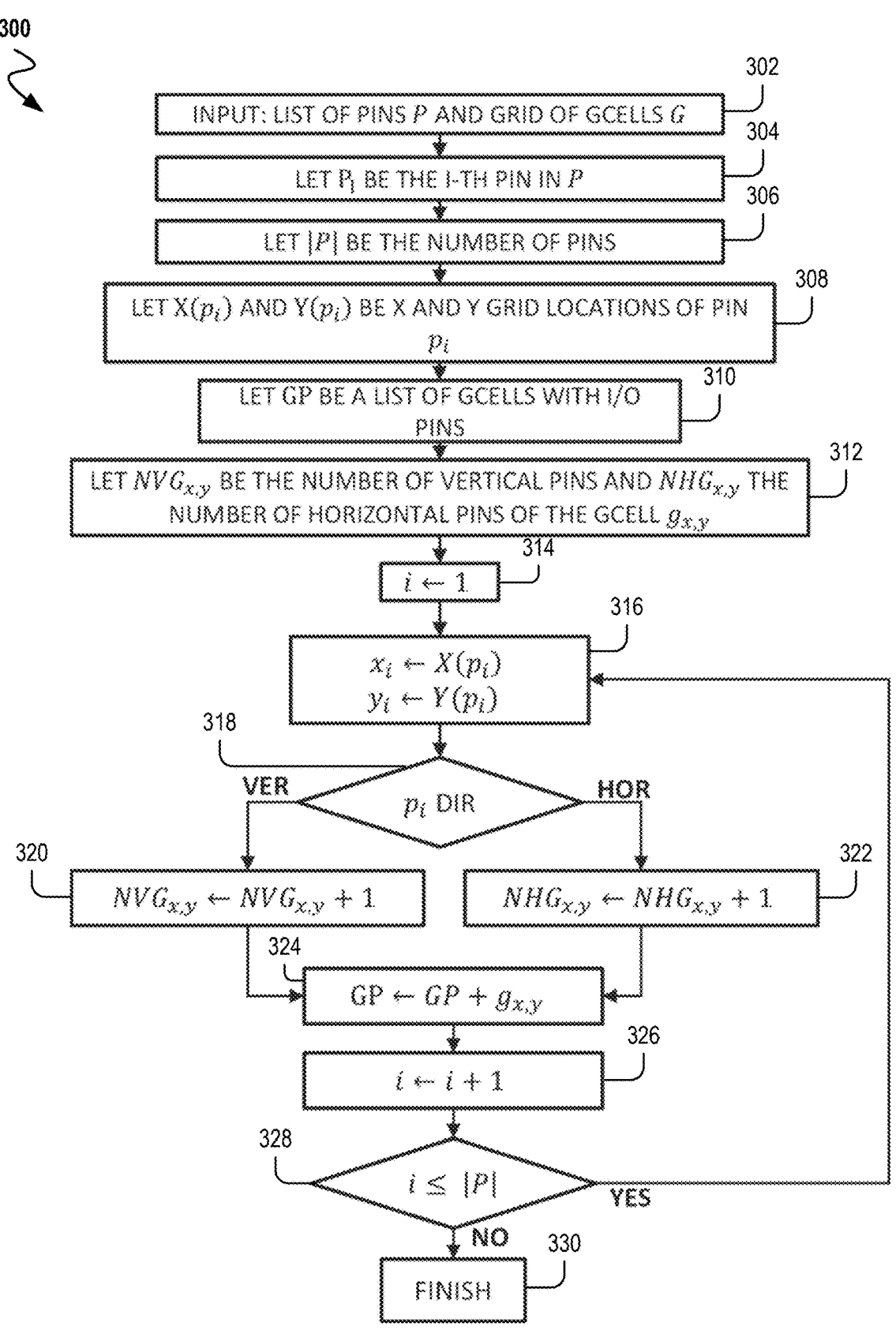

300

302 INPUT: LIST OF PINS $P$ AND GRID OF GCELLS $G$

304 LET $P_i$ BE THE I-TH PIN IN $P$

306 LET $|P|$ BE THE NUMBER OF PINS

308 LET $X(p_i)$ AND $Y(p_i)$ BE X AND Y GRID LOCATIONS OF PIN $p_i$

310 LET GP BE A LIST OF GCELLS WITH I/O PINS

312 LET $NVG_{x,y}$ BE THE NUMBER OF VERTICAL PINS AND $NHG_{x,y}$ THE NUMBER OF HORIZONTAL PINS OF THE GCELL $g_{x,y}$

314 $i \leftarrow 1$

316 $x_i \leftarrow X(p_i)$
$y_i \leftarrow Y(p_i)$

318 $p_i$ DIR

VER    HOR

320 $NVG_{x,y} \leftarrow NVG_{x,y} + 1$

322 $NHG_{x,y} \leftarrow NHG_{x,y} + 1$

324 $GP \leftarrow GP + g_{x,y}$

326 $i \leftarrow i + 1$

328 $i \leq |P|$

YES

NO

330 FINISH

SOFTWARE ARCHITECTURE 802

APPLICATIONS 810

ROUTING CAPACITY
ADJUSTMENT BASED ON
DETECTED REGIONS 842

API CALLS
812

FRAMEWORKS 808

MESSAGES
814

LIBRARIES 806

| SYSTEM 830 | API 832 | OTHER 834 |
|---|---|---|

OPERATING SYSTEM 804

| KERNEL 820 | SERVICES 822 | DRIVERS 824 |
|---|---|---|

MACHINE 900

| PROCESSORS 910 | MEMORY 930 | I/O COMPONENTS 950 |
|---|---|---|

GRID CELL ROUTING CAPACITY ADJUSTMENT FOR DETECTED REGIONS

TECHNICAL FIELD

Embodiments described herein relate to circuit design and, more particularly, to systems, methods, devices, and instructions for adjusting routing capacity of a grid cell for detected regions, such as notch regions (e.g., corners of macros, blockage corners) and input/output (I/O) pin regions, where the systems, methods, devices, and instructions can be part of electronic design automation (EDA).

BACKGROUND

Electronic design automation (EDA) software systems commonly perform routing of networks of circuit designs, such as clock networks (hereafter, clock nets). Usually, a network of a circuit design comprises a set of pins, and a routing process can route a path to connect the network. Net routing can be performed in two phases, where the first phase involves routing guides (e.g., global routing paths) that attempt to generate timing-aware/timing-based global routing of nets, and the second phase involves detailed routing of nets with specific wires (e.g., metal traces) based on the routing guides, while attempting to resolve/avoid one or more design rule violations.

BRIEF DESCRIPTION OF THE DRAWINGS

Various ones of the appended drawings merely illustrate various embodiments of the present disclosure and should not be considered as limiting its scope.

FIGS. 2 through 4 are flowcharts illustrating example methods for adjusting routing capacity of one or more grid cells of one or more layers of a circuit design based on detected regions, according to some embodiments.

DETAILED DESCRIPTION

Figure 1:
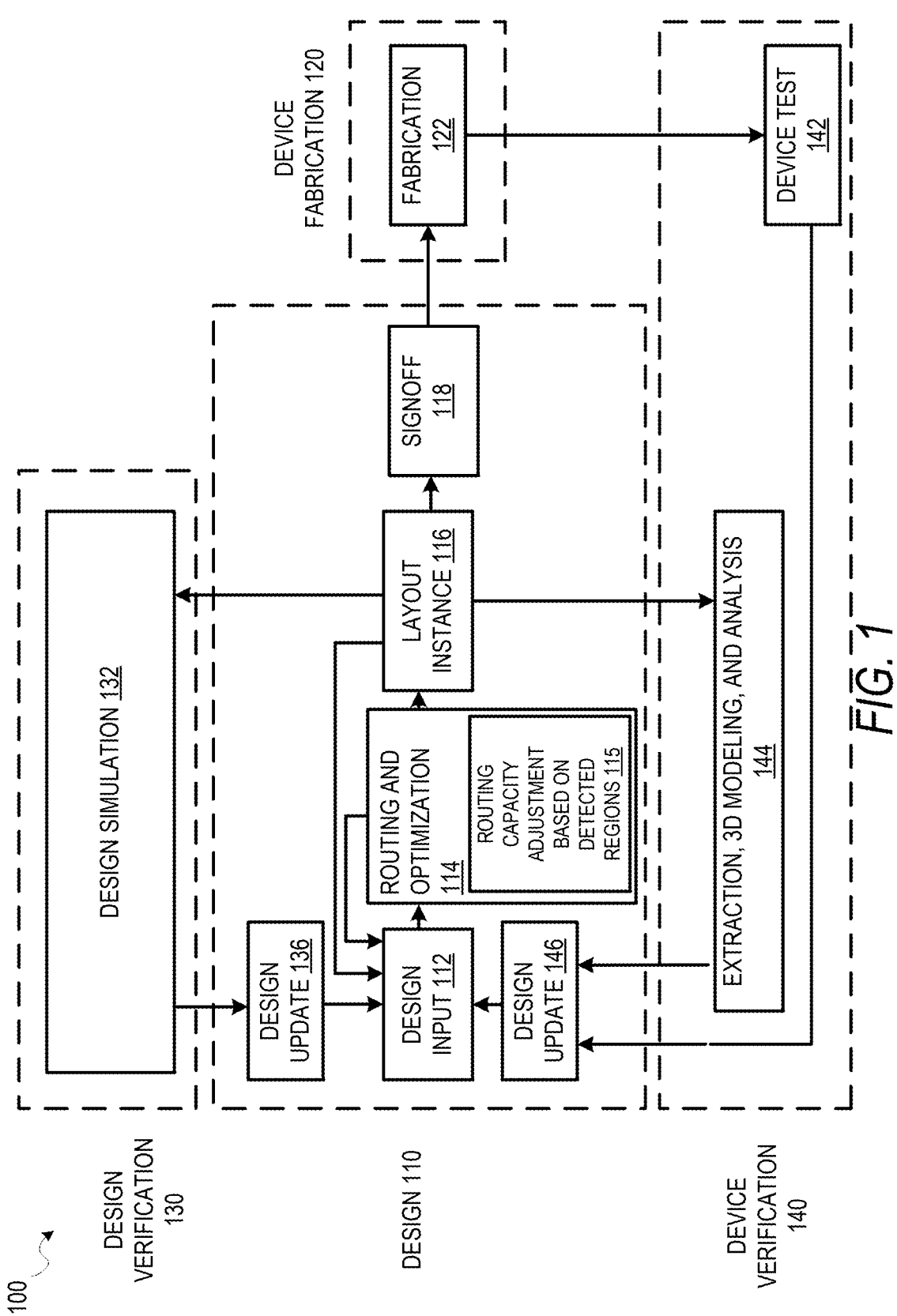
FIG. 1 is a diagram illustrating an example design process flow for adjusting routing capacity of a grid cell of one or more layers of a circuit design based on detected regions, according to some embodiments.

Global routing can comprise two-dimensional (2D) net routing, layer assignment of wires of nets, and track assignment of wires of nets. Resolving congestion and major design rule constraints (DRCs) during global routing can facilitate detailed routing of nets. Conventional global routing can route nets of a circuit design by dividing the circuit design (e.g., the design region) into a grid of cells (also referred to as "global routing cells," "grid cell," or "Gcells"), where each grid cell comprises a set number of resources (e.g., horizontal and vertical (or per layer) resources, such as tracks) for routing a net, referred to as capacity, and a number of resources that are currently being used or demanded by global routing to route a network, referred to as demand. A Gcell can be square or rectangle in shape. Overflow for a given grid cell is usually determined by subtracting the demand for the given grid from the capacity of the given grid, where an overflow comprising a negative number indicates more demand for routing resources than available capacity of resources. A grid cell can be considered congested if the number of resources of the grid cell is less than what is needed to route a network through the grid cell, which is indicated by a negative number for overflow.

Based on the grid of cells, global routing can route a net of the circuit design by assigning the net to a set of specific grid cells and a set of specific layers (metal layer) of the circuit design. Generally, using grid cells permits global routing to speed up the process of finding the net routing solutions by analyzing routing congestion based on grid cell congestion and by reducing the number of pathways to consider for net routing.

In a circuit design, notch regions, blockage corners, and input/output (I/O) pin regions can have a negative impact on routing congestion. Generally, nets turn around notch regions and blockage corners. As a result, notch regions and blockage corners often become very congested and have routing rule violations. Additionally, for I/O pins of a circuit design that are very close to each other, the I/O pin region can have a negative impact on routing congestion within the circuit design as there is no room for layer shifting or joggings.

Various embodiments provide for adjusting routing capacity of a grid cell of one or more layers of a circuit design based on detected regions, such as notch regions (e.g., corners of macros, blockage corners) and input/output (IO) pin regions. Some embodiments can be used in global routing of a circuit design and may be part of electronic design automation (EDA). More particularly, various embodiments detect one or more notch regions in a circuit design, detect one or more I/O pin regions in the circuit design, and adjust (e.g., reduce) routing capacity of one or more grid cells (Gcells) of one or more detected regions. An embodiment can perform such operations based on circuit data that describes one or more shapes (e.g., core shapes), I/O pins, or both of a circuit design. After adjustment (e.g., reduction) of one or more grid cells, the routing capacity can be used to generate a congestion map for the circuit design, which can facilitate routing (e.g., global routing) of a net of the circuit design (e.g., clock net, data net, etc.). According to various embodiments, the resulting congestion map is more accurate than conventional methodologies.

As used herein, a notch region (or notch) can comprise a corner of a design or a macro of a circuit design. For example, a notch region of a circuit design can be a region around a concave corner on the circuit design's boundary. Generally, a notch region can be where one or more wires of a circuit design make a turn, which can result in a routing congestion. A notch region can be detected (e.g., identified) by scanning a circuit design with a grid cell window (e.g., a 2×2 grid cell window) and, when exactly one of grid cells (e.g., one of the 2×2 grid cell window) is in an out-of-design region, the grid cell diagonal to the out-of-design region is considered a notch region. A macro corner region can be detected (e.g., identified) by scanning a circuit design with a grid cell window (e.g., a 2×2 grid cell window) and, when exactly one of grid cells (e.g., one of the 2×2 grid cell window) is inside a macro (e.g., where routing capacity is zero), the location grid cell diagonal to the grid cell inside the macro is a macro corner.

As used herein, an input/output (I/O) pin region can comprise a vertical or horizontal cluster of grid cells. A I/O pin region can be detected (e.g., identified) by finding one or more grid cells with pins. For example, one or more grid cells that each comprise a predetermined (e.g., threshold) number of pins are used as a seeds, and those grid cells are grouped with neighbor grid cells with pins using a depth-first search (DFS). For some embodiments, one or more grid cells with pins are determined (e.g., identified or found), and one or more I/O pin regions are determined (e.g., detected) based on the one or more grid cells.

As used herein, global routing can comprise determining a routing plan (e.g., one or more routing guides) for routing a physical wire (e.g., interconnect line or wire) within a circuit design between two or more nodes of circuit design (e.g., two pins or a source and a pin). For instance, global routing can route a wire (of a net of the circuit design) within the circuit design by dividing the circuit design (e.g., dividing each of one or more layers of the circuit design) into a grid of cells (e.g., grid cells), where each cell comprises a set number of resources (e.g., horizontal and vertical resources, such as tracks) for routing the wire. For some embodiments, each layer of a circuit design comprises its own grid of cells (e.g., grid cells). Additionally, for some embodiments, a routing blockage of a circuit design (e.g., on a layer of the circuit design) is marked with respect to a cell (e.g., grid cell) in the grid. Global routing can consider/account for one or more routing blockages of the circuit design when determining a route plan for a wire within the circuit design.

Global routing can route a wire (of the net) by assigning the net to a set of specific grid cells and a set of specific layers (metal layers) of the circuit design. In doing so, global routing can generate a routing plan for the wire that describes a set of connected cells (e.g., grid cells) between two or more nodes of the circuit design that does not include obstructed cells. The routing plan (e.g., global routing plan) can comprise one or more routing guides that serve as "loose" routing paths or routing areas within which detailed routing can route a physical wire between two or more nodes (e.g., pins) of a circuit design.

As used herein, detailed routing can comprise routing a physical wire (e.g., interconnect wire) within a circuit design, between two or more nodes of the circuit design, based on a routing plan determined by global routing for the circuit design. The routing plan can provide a detailed routing process with a topology for routing wires, which in turn can enable detailed routing to route wires without violating one or more design rule constraints (DRCs) associated with a circuit design. This can be referred to as detailed routing being performed with clean DRCs. Accordingly, for some embodiments, global routing is performed on a circuit design prior to detailed routing being performed on the circuit design. Generally, global routing can be performed on a circuit design faster than performing detailed routing on the same circuit design. The routed wires of a circuit design can form a network of the circuit design.

As used herein, a congestion map can describe a measure (e.g., estimated measure) of routing congestion for a set of grid cells on layer(s) (e.g., metal layers) of a circuit design, where the layers serve as interconnect structures for the circuit design. A measure of routing congestion for a given grid cell can be represented by one or more congestion ratios, such as one ratio for a horizontal routing resource and another ratio for a vertical routing resource. For example, a congestion ratio for a horizontal routing resource of a given grid can comprise a total number of horizontal routing resources demanded from the given grid cell by circuit elements (e.g., logical devices of the circuit design) within the given grid cell, divided by a total number of horizontal routing resources available (supplied) by the given grid cell. A congestion map can be implemented as a data structure, such as a two-dimensional array, for storing measured interconnect congestion for individual cells of the set of grid cells.

As used herein, a capacity map can describe a measure of routing resource capacity of a set of grid cells for layer(s) of a circuit design, such as horizontal and vertical resources (e.g., tracks) for routing a wire through each grid cell. For some embodiments, a capacity map is used by global routing to generate a set of routing guides between at least two nodes of the circuit design (e.g., between two pins or between a source and a pin). A capacity map for a circuit design can be generated based on a routing resource capacity (or routing capacity) of a set of grid cells for one or more layers of the circuit design.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for adjusting routing capacity of a grid cell of one or more layers of a circuit design based on detected regions, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. Though not shown, the routing and optimization 114 operation can include a clock tree synthesis (CTS) operation, which can generate one or more clock trees that deliver clock signal from clock sources of a circuit design to a plurality of clock tree leaf nodes comprising clock tree pins (e.g., of circuit devices, such as flip-flops) within the circuit design. The routing and optimization 114 operation may also include other operations not shown, such as those relating to floorplanning, placement, post-placement optimization, and post-routing optimization. As shown, the routing and optimization 114 operation includes a routing capacity adjustment based on detected regions operation 115, which may be performed in accordance with various embodiments described herein. For some embodiments, operation 115 can be performed prior to detailed routing of a circuit design and, more particularly, during (e.g., as part of) global routing of the circuit design.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design, after routing, during register transfer level (RTL) operations, or as part of a signoff 118, as described below.

Design inputs are used in the design input 112 operation to generate an initial circuit layout. The design inputs may be further processed during the design input 112 operation via a process, such as logic-synthesis, to generate a circuit netlist mapped to a target standard library manufacturable by the foundry in fabrication 122 operation. After design inputs are used in the design input 112 operation to generate an initial circuit layout, and any of the routing and optimization 114 operations are performed, a resulting layout is generated as the layout instance 116. The netlist as placed by the layout instance 116 describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations, and layout modifications generated based on actual device performance.

As described in more detail below, a design update 136 from the design simulation 132; a design update 146 from the device test 142 or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

FIGS. 2 through 7 are flowcharts illustrating example methods for adjusting routing capacity of one or more grid cells of one or more layers of a circuit design based on detected regions, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Referring now to FIG. 2, the flowchart illustrates an example method 200 for adjusting routing capacity of one or more grid cells of one or more layers of a circuit design based on detected regions, according to some embodiments. For some embodiments, the method 200 is performed as part of a global routing process with respect to a circuit design (e.g., by an EDA software system). An operation of the method 200 (or another method described herein) may be performed by a hardware processor (e.g., central processing unit or graphics processing unit) of a computing device (e.g., desktop, server, etc.).

As illustrated, operation 202 of the method 200 accesses circuit data that describes a set of shapes of a circuit design, a set of I/O pins of the circuit design, and a set of grid cells of one or more layers of the circuit design. The circuit data can describe, without limitation, one or more of grid cell location, a layer stack (e.g., comprising layers at different horizontal levels), I/O pin locations, and pre-routed wires of the circuit design.

The method 200 continues with operation 204 determines (e.g., identifies or detects) a set of notch regions of the circuit design based on the set of shapes. The set of shapes can include, without limitations, one or more macros, cells, intellectual property (TP) blocks, and the like. Additionally, a notch region can comprise a corner of a macro of the circuit design, or a concave corner of a boundary of the circuit design. For some embodiments, operation 204 comprises scanning the set of grid cells using a grid cell window having a predetermined dimension. For instance, the predetermined dimension of the grid cell window can be two grid cells by two grid cells (e.g., 2×2 grid cell window). During the scanning, an embodiment can detect, based on the set of shapes, whether a current region of the circuit design that falls within the grid cell window satisfies a notch region detection condition. In response to the notch region detection condition being satisfied by the current region, the current region can be added to the set of notch regions.

For some embodiments, the notch region detection condition comprises at least one grid cell of the grid cell window lying outside of a select shape of the set of shapes, where the notch region (detected by satisfaction of the notch region detection condition) can comprise (e.g., correspond to a region that includes) a concave corner of a boundary (e.g., design boundary) of the circuit design. For example, where the grid cell window comprises a 2×2 grid cell window, when exactly one of the four grid cells is in an out-of-design region, the grid cell diagonal to the out-of-design grid cell can be considered a notch of the circuit design.

In various embodiments, the notch region detection condition comprises at least one grid cell of the grid cell window lying inside of a select shape of the set of shapes, the select shape being a macro, where the notch region (detected by satisfaction of the notch region detection condition) can comprise a corner of the macro. For example, where the grid cell window comprises a 2×2 grid cell window, when one of the four grid cells is inside a macro of the circuit design (e.g., where routing capacity is zero), a grid cell located diagonal to the grid cell inside the macro is a macro corner. More regarding determining the set of notch regions is described with respect to FIG. 5.

Operation 206 of the method 200 determines (e.g., identifies or detects) a set of I/O pin regions of the circuit design based on the set of I/O pins. For some embodiments, operation 206 comprises: determining an initial subset of the set of grid cells that comprise at least one of the set of I/O pins; determining, from the initial subset of grid cells, a select subset of grid cells where each grid cell has a pin count greater than a pin count threshold value (e.g., 3 I/O pins); and determining one or more groupings (e.g., clusters)

of adjacent grid cells (e.g., neighboring grid cells) within the select subset of grid cells, where each individual grouping forms an individual I/O pin region in the set of I/O pin regions. The individual grouping can comprise vertically adjacent grid cells that each include vertical pins, or can comprise horizontally adjacent grid cells that each include horizontal pins. The pin count threshold value can define a level of pin congestion (e.g., number of I/O pins close to each other) needed in a region for that region to be identified as an I/O pin region (e.g., and likely to lead to routing congestion). The pin count threshold value can be a default value or a user-defined value, which can permit a user to tune the overall I/O region detection process. More regarding determining the set of I/O pin regions is described with respect to FIGS. 3, 4, and 6.

At operation 208, a routing capacity of a select grid cell in the set of grid cells is adjusted based on at least one of the set of notch regions (determined by operation 204) or the set of I/O pin regions (determined by operation 206). For some embodiments, operation 208 comprises expanding each individual region, in the set of notch regions and the set of I/O pin regions, based on a region expansion scale value, which expands each individual region to include grid cells neighboring the individual region. In this way, the region expansion scale value can define the size by which each individual region is expanded after the regions (e.g., the detected notch regions and detected I/O pin regions). Depending on the embodiment, the region expansion scale value can be a default value or a user-defined value. In various embodiments, each of the individual regions are expanded prior to any routing capacities of grid cells being adjusted by operation 208.

For some embodiments, operation 208 comprises updating routing capacities of one or more grid cells (of the set of grid cells) within an individual region based on a routing capacity adjustment scale value, where the individual region is from one of the set of notch regions or the set of I/O pin regions. For example, the routing capacities of the one or more grid cells within the individual region can be reduced by the routing capacity adjustment scale value. The routing capacity adjustment scale value can be a user-defined value, and the routing capacity adjustment scale value can range between 0.0 through 1.0.

For some embodiments, operation 208 comprises updating routing capacities of one or more grid cells (of the set of grid cells) that neighbor the individual region based on respective distances from the individual region. For example, an embodiment can use a size value for vicinity capacity reduction region, which can determine which grid cells adjacent to an individual region will be considered neighboring grid cells.

According to some embodiments, a routing capacity ($C_i$) of an individual grid cell (i-th grid cell) is adjusted based on the following Equation 1:

$$C_i' = C_i \cdot \left(1 - \max_x\left((1 - A_x) \cdot \max\left(0, \frac{(F_x - d(G_i, G_x))}{F_x}\right)\right) \forall\, x \in X\right),$$

where $C_i$ is a routing capacity of the i-th grid cell before adjustment (e.g., reduction), $C_i'$ is the routing capacity of the i-th grid cell after adjustment, X is a set of all capacity adjustment regions, $G_i$ is the i-th grid cell in the design, $G_x$ is a grid cell of a region x, $A_x$ is a routing capacity adjustment factor value (e.g., between 0.0-1.0) for region x, $F_x$ is the effective distance of routing capacity adjustment for the region x, and $d(G_i, G_x)$ is a distance between the grid cell $G_i$ and the grid cell $G_x$. More regarding adjustment of routing capacities is described with respect to FIG. 7.

Referring now to FIG. 3, the flowchart illustrates an example method 300 for determining (e.g., identifying or finding) grid cells with I/O pins, according to some embodiments. For instance, the method 300 can represent an example implementation of at least a portion of operation 206. As illustrated, operation 302 of the method 300 a list of pins P and list of grid cells G of a circuit design are received as input. Operation 304 initializes (e.g., creates) variable $p_i$ to be the i-th pin in the list of pins P, operation 306 initializes (e.g., creates) variable |P| to be the number of pins in the list of pins P, operation 308 initializes (e.g., creates) variable $X(p_i)$ and $Y(p_i)$ to be the x and y grid locations of the i-th pin, operation 310 initializes (e.g., creates) variable GP be a list of grid cells with I/O pins, operation 312 initializes (e.g., creates) variable $NVG_{x,y}$ to be a number of vertical I/O pins and variable $NHG_{x,y}$ to be a number of horizontal I/O pins of a grid cell $g_{x,y}$ at x and y grid locations, and operation 314 initializes (e.g., creates) an iteration count variable i with a value of one.

At operation 316, variable $x_i$ is set to a current value of variable $X(p_i)$, and variable $y_i$ is set to a current value of variable $Y(p_i)$. During operation 318, a direction of the i-th pin $p_i$ is determined. If the direction of the i-th pin $p_i$ is vertical, the method 300 proceeds to operation 320, and if the direction of the i-th pin $p_i$ is horizonal, the method 300 proceeds to operation 322. At operation 320, the value of $NVG_{x,y}$ is incremented by one (by setting $NVG_{x,y}$ to $NVG_{x,y}+1$), while at operation 322, the value of $NHG_{x,y}$ is incremented by one (by setting $NHG_{x,y}$ to $NHG_{x,y}+1$). After operation 320 or 322, the method 300 proceeds to operation 324, where a grid cell $g_{x,y}$ to the list of grid cell GP. Thereafter, operation 326 increments variable i by one (by setting i to i+1). If the value of i is less than or equal to |P| (the number of pins in the list of pins P) at operation 328, the method 300 returns to operation 316. However, if the value of i is not less than or equal to |P| (the number of pins in the list of pins P) at operation 328, the method 300 finishes at operation 330. By operations 316 through 328, new grid cells are added to a new grid grouping (e.g., grid cluster) and the search is expanded left/right (e.g., horizontally) or bottom/top (e.g., vertically) for other grid cells for the grouping. The grouping (e.g., cluster) stops expanding if the number of pins on the current grid cell reach zero.

Figure 4:
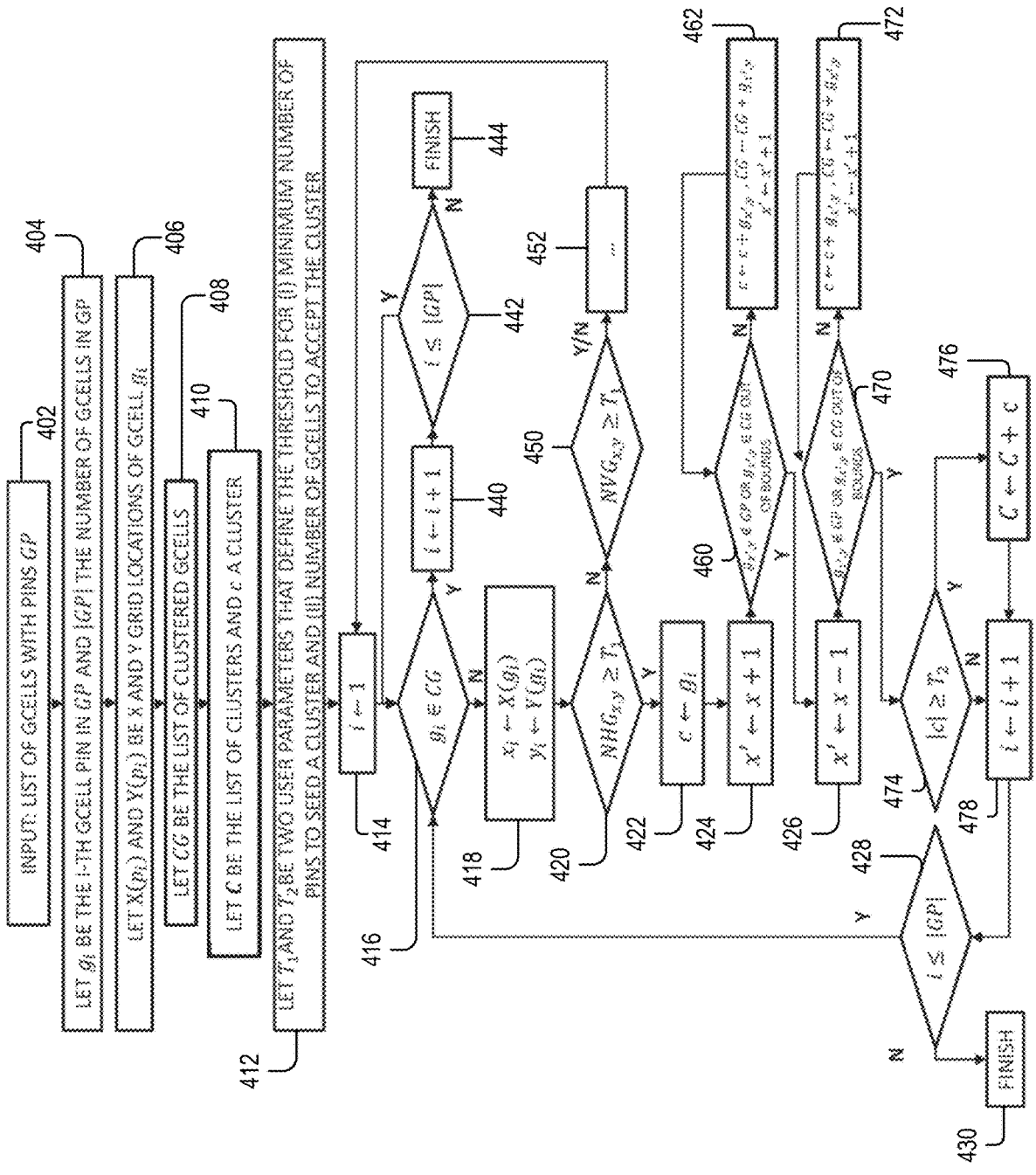

Referring now to FIG. 4, the flowchart illustrates an example method 400 for determining (e.g., identifying or finding) I/O pin regions, according to some embodiments. For instance, the method 400 can represent an example implementation of at least a portion of operation 206. As illustrated, operation 402 of the method 400 a list of grid cells GP with I/O pins, which can be determined by the method 300 of FIG. 3. Operation 404 initializes (e.g., creates) variable $g_i$ to be the i-th grid cell in GP and a variable |GP| to be the number of grid cells in the list of grids GP, operation 406 initializes (e.g., creates) variable $X(g_i)$ and $Y(g_i)$ to be the x and y grid locations of the i-th grid cell, operation 408 initializes (e.g., creates) variable CG to be a list of clustered grid cells, operation 410 initializes (e.g., creates) variable C to be a list of clusters of grid cells and variable c to be an individual cluster from the list, and operation 412 initializes (e.g., creates) variable $T_1$ and $T_2$ to be two user parameters that respectively define (i) a threshold for minimum number of I/O pins to seed a cluster, and (ii) a threshold for the number of grid cells to accept a cluster.

At operation 414, an iteration count variable i is initialized (e.g., created) with a value of one. Subsequently, operation 416 determines whether the i-th grid cell $g_i$ is currently a member of a list of clustered grid cells CG (which initially starts empty). If yes, the method 400 proceeds to operation 440, otherwise the method 400 proceeds to operation 418. Operation 440 and the operations that flow therefrom enable the method 400 to proceed with a next grid cell in the list of grid cells GP with I/O pins. Operation 418 and the operations that flow therefrom enable the method 400 to add the i-th grid cell $g_i$ to the list of clustered grid cells CG and expand the search for additional grid cells (to add to the list of clustered grid cells CG) in either the left/right direction, or the up/down (e.g., bottom/top) direction.

Operation 440 increments variable i by one (by setting i to i+1). Thereafter, operation 442 determines whether the variable i is less than or equal to the number of grid cells in the list of grid cells GP with I/O pins (|GP|), and if so the method 400 proceeds to operation 416, otherwise the method 400 proceeds to operation 444 where the method 400 finishes.

During operation 418, variable $x_i$ is set to a current value of variable $X(g_i)$, and variable $y_i$ is set to a current value of variable $Y(g_i)$. Thereafter, operation 420 determines whether variable $NVG_{x,y}$ (which represents the number of vertical I/O pins of a grid cell $g_{x,y}$ at x and y grid locations) is greater than or equal to parameter $T_1$, and if so the method 400 proceeds to operation 422, otherwise the method 400 proceeds to operation 450. Operations 422, 424, 460, 462 426, 470, 472 are performed with respect to the x and x' variables and handle horizontal I/O pin regions.

At operation 422, the current individual cluster c is set to be the i-th grid cell $g_i$ (by $c \leftarrow g_i$) Thereafter, operation 424 sets variable x' to the current value of variable x plus one (x+1). Operation 460 then determines whether the grid cell $g_{x,y}$ at x and y grid locations is not a member of the list of grid cells GP with I/O pins or the grid cell $g_{x,y}$ is a member of the list of clustered grid cells CG, and if so the method 400 proceeds to operation 426 (and the grid cell $g_{x,y}$ is considered out of bounds), otherwise the method 400 proceeds with operation 462. During operation 462, the grid cell $g_{x,y}$ at x and y grid locations is added to the current individual cluster c (by $c \leftarrow c + g'_{x,y}$), adding the grid cell $g_{x,y}$ to the list of clustered grid cells CG (by $CG \leftarrow CG + g'_{x,y}$), and variable x' is incremented by one (x'←x'+1). After operation 462, the method returns to operation 460.

Operations 426, 470, 472 facilitate expansion of the search for grid cells to add to the list of clustered grid cells CG in a second (opposite direction). During operation 426, variable x' is set to the current value of variable x minus one (x−1). Operation 470 then determines whether the grid cell $g_{x,y}$ at x and y grid locations is not a member of the list of grid cells GP with I/O pins or the grid cell $g_{x,y}$ is a member of the list of clustered grid cells CG, and if so the method 400 proceeds to operation 474 (and the grid cell $g_{x,y}$ is considered out of bounds), otherwise the method 400 proceeds with operation 472. During operation 472, the grid cell $g_{x,y}$ at x and y grid locations is added to the current individual cluster c (by $c \leftarrow c + g'_{x,y}$), adding the grid cell $g_{x,y}$ to the list of clustered grid cells CG (by $CG \leftarrow CG + g'_{x,y}$), and variable x' is incremented by one (x'←x'+1). After operation 472, the method returns to operation 470.

Operation 474 determines whether a number of grid cells in the cluster individual cluster c (represented by |c|) is greater than or equal to parameter $T_2$, and if so the method 400 proceeds to operation 476, otherwise the method 400 proceeds to operation 478. At operation 476, the current individual cluster is added to the list of clusters C (by setting C←C+c), and thereafter, the method 400 processed to operation 478. During operation 478, variable i is incremented by one (by setting i to i+1). After operation 478, operation 428 determines whether the variable i is less than or equal to a number of grid cells in the list of grid cells GP with I/O pins, and if so the method 400 returns to operation 416, otherwise the method 400 proceeds to operation 430 where the method 400 finishes.

Operation 450 determines whether variable NHGx,y (which represents the number of horizontal I/O pins of a grid cell $g_{x,y}$ at x and y grid locations) is greater than or equal to parameter $T_1$, and if so the method 400 proceeds to operation 452, otherwise the method 400 returns to operation 414. Operation 452 represents operations and flow that are similar to operations 422, 424, 460, 463, 426, 470, 472 but with the x and x' variables replaced with the y and y' variables respectively (to handle vertical I/O pin regions).

Overall, by performance of the method 400, all grid cells in the list of grid cells GP with I/O pins can be traversed while grid cells already clustered (e.g., grid cells in CG) are ignored. If a given grid cell is not clustered, the location of the given grid cell can be determined and it can be determined whether the given grid cell can be a seed for a new cluster (e.g., by checking if the number of vertical or horizontal I/O pins of the given grid cell is larger than the parameter $T_1$). If the given grid cell can be a seed for a new cluster, the given grid cell can be added to a new cluster and the search for additional grid cells is expanded (e.g., to the left or the right, or to the top or the bottom of the given grid cell). This search expansion can eventually stop if the number of I/O pins of a current grid cell (being evaluated during the search) is zero. The cluster can be accepted if the number of grid cells in the cluster is larger than the parameter $T_2$.

Figure 5:
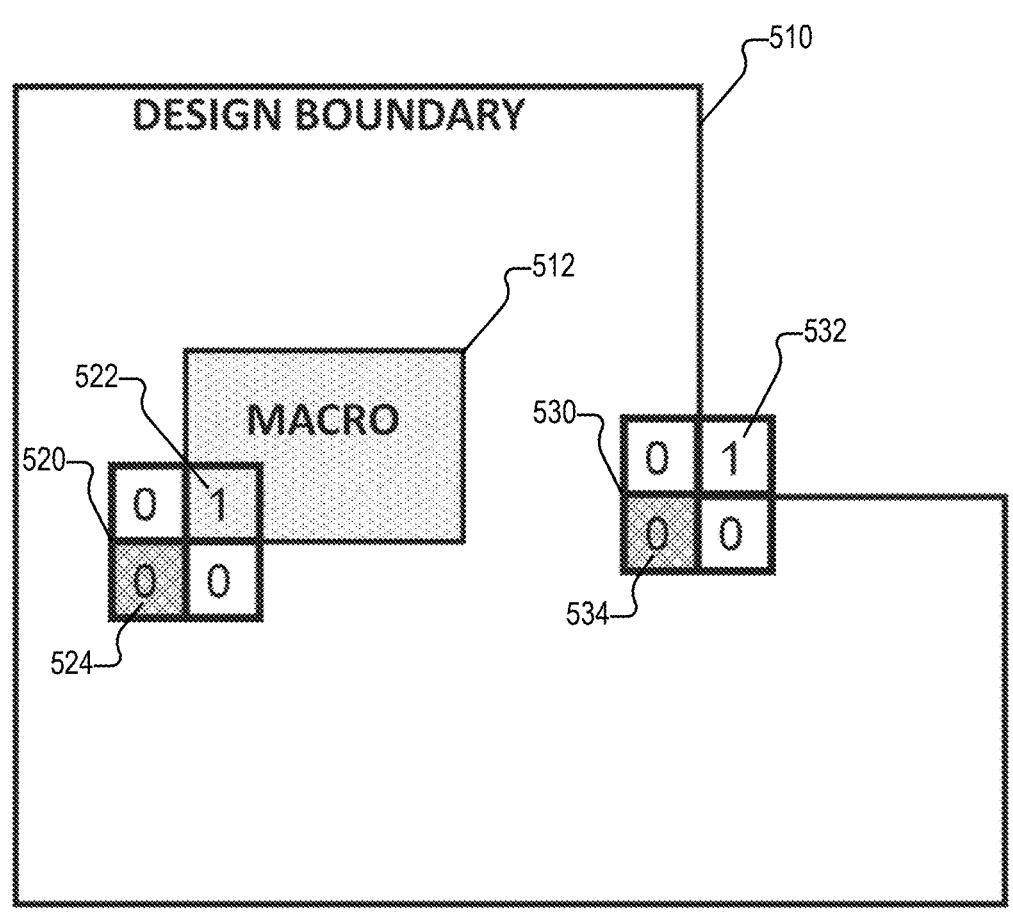
FIG. 5 is a diagram illustrating use of an example grid cell window for scanning a set of grid cells of an example circuit design, according to some embodiments.

FIG. 5 is a diagram illustrating use of an example grid cell window for scanning a set of grid cells of an example circuit design 500, according to some embodiments. In FIG. 5, the circuit design 500 includes a design boundary 510 and a macro 512. As illustrated, the example grid cell window used has a size of two grid cells by two grid cells. Grid cell window 520 represents an instance when the example grid cell window detects a first example notch region, and grid cell window 530 represents another instance when the example grid cell window detects a second example notch region. With respect to the first example notch region, the example grid cell window detects a corner of the macro 512, where portion 522 of grid cell window 520 is within the macro 512 and portion 524 of grid cell window 520 (which is diagonally across from portion 522) is identified as the corner of the macro 512. With respect to the second example notch region, the example grid cell window detects a concave corner of the design boundary 510 of the circuit design 500, where portion 532 of grid cell window 530 is outside the design boundary 510 and portion 534 of grid cell window 530 (which is diagonally across from portion 532) is identified as the concave corner (or notch) of the design boundary 510.

Figure 6:
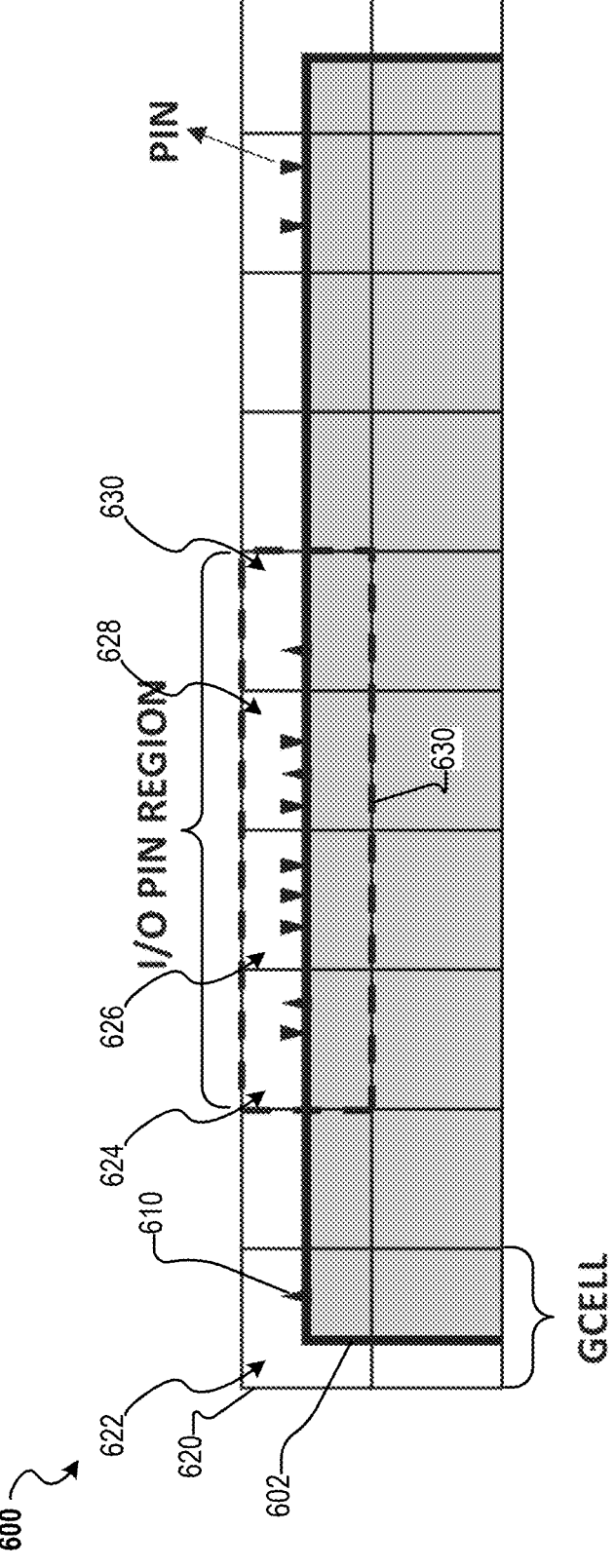
FIG. 6 is a diagram illustrating an example of detecting for input/output (I/O) pin regions of an example circuit design, according to some embodiments.

FIG. 6 is a diagram illustrating an example of detecting for I/O pin regions of an example circuit design 600, according to some embodiments. In FIG. 6, the circuit design 600 includes I/O pins such as I/O pin 610, which can be disposed along the edge of a design boundary 602 of the circuit design 600. FIG. 6 shows grid cells 620 associated with the circuit design 600. FIG. 6 also shows that the I/O pins can be inbound or outbound I/O pins. While the I/O pins illustrated in FIG. 6 are horizontal I/O pins, which can result in one or more horizontal clusters of grid cells for I/O regions, some circuit design can include vertical I/O pins, which can result in one or more vertical clusters of grid cells for I/O regions. As described herein, an embodiment can detect a cluster of grid cells by determining (e.g., finding or identifying) grid cells with I/O pins, such grid cells 622, 624, 626, 628, 630. From those determined grid cells, an embodiment can use a select grid cell (e.g., grid cell 624) having a given number of I/O pins as a seed for the cluster, and the select grid cell can be grouped with neighboring grid cells with I/O pins (e.g., grid cells 626, 628, 630) to form a cluster of grid cells (e.g., 630), which can represent an I/O pin region.

Figure 7:
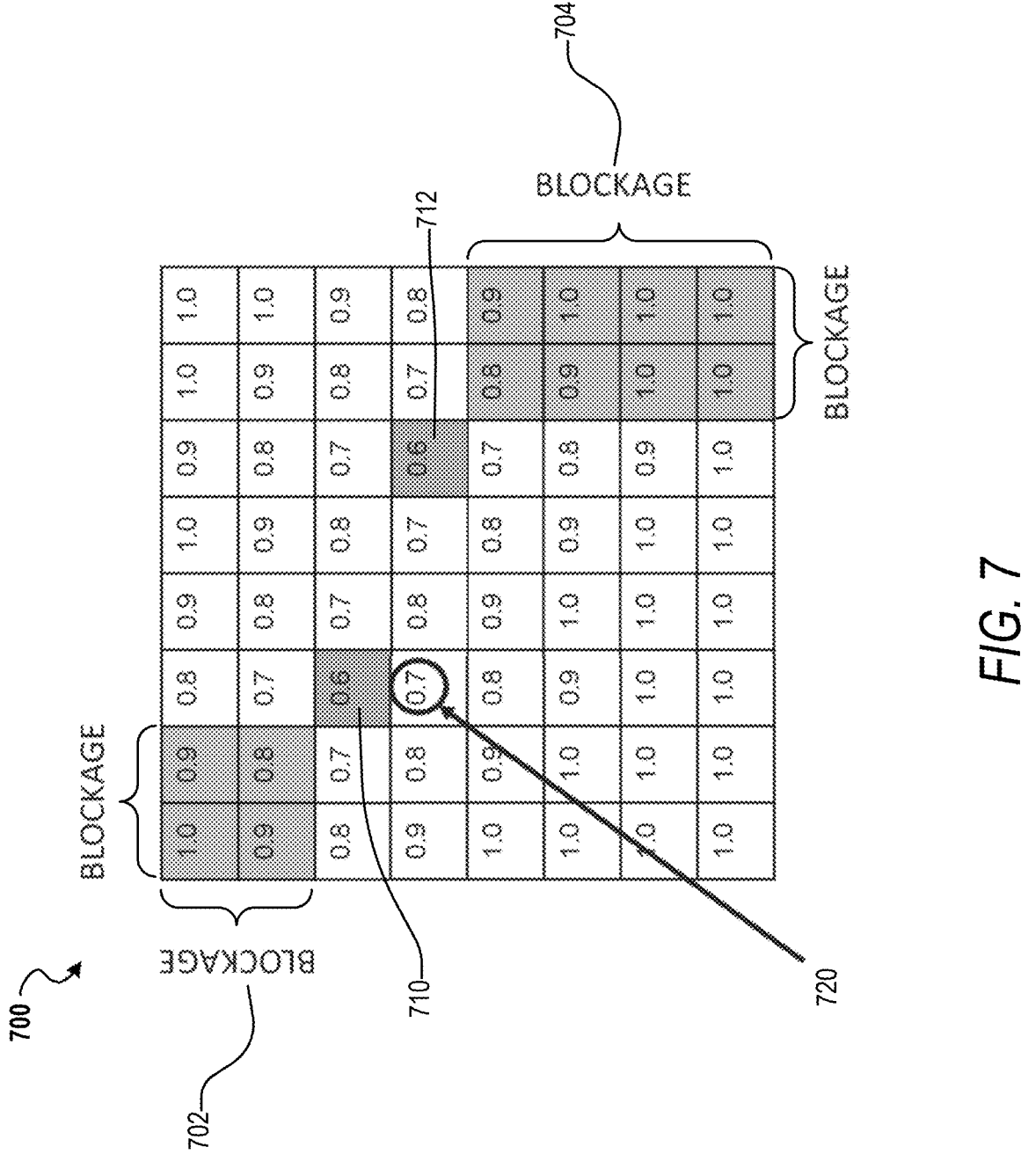
FIG. 7 is a diagram illustrating an example of adjusting routing capacities of grid cells associated with an example circuit design, according to some embodiments.

FIG. 7 is a diagram illustrating an example of adjusting routing capacities of grid cells 700 associated with an example circuit design, according to some embodiments. With respect to the grid cells 700, FIG. 7 illustrates routing blockages 702, 704 (e.g., corresponding to portions of macros of a circuit design). Grid cells 710, 712 represent examples of grid cells that have had their respective routing capacities adjusted based on detection of notch regions (e.g., macro corners) in accordance with some embodiments described herein. Additionally, based on an adjusted routing capacity of a grid cell based on a detected region (e.g., detected notch region), routing capacities of one or more neighboring grid cells can be adjusted in accordance with some embodiments described herein. For example, based on the routing capacity of grid cell 710 being adjusted to a value of 0.6, an embodiments can adjust the routing capacity of neighboring grid cell 720 based on Equation 1 as follows: distance $d(G_i, G_1)=1$; distance $d(G_i, G_2)=3$; adjustment at $$G_i \text{ for } G_1 = \left( (1 - 0.6) \cdot \frac{4 - 1}{4} \right) = 0.3;$$

adjustment at $G_i$ for $$G_2 = \left( (1 - 0.6) \cdot \frac{4 - 3}{4} \right) = 0.1;$$

capacity scale at $G_i=(1-\max(0.3, 0.1))=0.7$.

Figure 8:
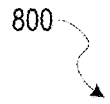
FIG. 8 is a block diagram illustrating an example of a software architecture that may be operating on an electronic design automation (EDA) computing device and may be used with methods for adjusting routing capacity of one or more grid cells of one or more layers of a circuit design based on detected regions, according to some embodiments.

FIG. 8 is a block diagram 800 illustrating an example of a software architecture 802 that may be operating on an EDA computer and may be used with methods for adjusting routing capacity of one or more grid cells of one or more layers of a circuit design based on detected regions, according to some embodiments. The software architecture 802 can be used as an EDA computing device to implement any of the methods described above. Aspects of the software architecture 802 may, in various embodiments, be used to store circuit designs, and to facilitate generation of a circuit design in an EDA environment by adjusting routing capacity of one or more grid cells of one or more layers of a circuit design based on detected regions.

FIG. 8 is merely a non-limiting example of a software architecture 802, and it will be appreciated that many other architectures can be implemented to facilitate the functionality described herein. In various embodiments, the software architecture 802 is implemented by hardware such as a machine 900 of FIG. 9 that includes processors 910, memory 930, and I/O components 950. In this example, the software architecture 802 can be conceptualized as a stack of layers where each layer may provide a particular functionality. For example, the software architecture 802 includes layers such as an operating system 804, libraries 806, software frameworks 808, and applications 810. Operationally, the applications 810 invoke application programming interface (API) calls 812 through the software stack and receive messages 814 in response to the API calls 812, consistent with some embodiments. In various embodiments, any client device, any server computer of a server system, or any other device described herein may operate using elements of the software architecture 802. An EDA computing device described herein may additionally be implemented using aspects of the software architecture 802, with the software architecture 802 adapted for operating routing capacity adjustment in any manner described herein.

In some embodiments, an EDA application of the applications 810 performs routing capacity adjustment according to embodiments described herein using various modules within the software architecture 802. For example, in some embodiments, an EDA computing device similar to the machine 900 includes the memory 930 and the one or more processors 910. The processors 910 also implement a (circuit design) routing capacity adjustment based on detected regions module 842 for adjusting routing capacity of one or more grid cells of one or more layers of a circuit design based on detected regions, in accordance with various embodiments described herein.

In various other embodiments, rather than being implemented as modules of the one or more applications 810, the routing capacity adjustment based on detected regions module 842 may be implemented using elements of the libraries 806, the operating system 804, or the software frameworks 808.

In various implementations, the operating system 804 manages hardware resources and provides common services. The operating system 804 includes, for example, a kernel 820, services 822, and drivers 824. The kernel 820 acts as an abstraction layer between the hardware and the other software layers, consistent with some embodiments. For example, the kernel 820 provides memory management, processor management (e.g., scheduling), component management, networking, and security settings, among other functionality. The services 822 can provide other common services for the other software layers. The drivers 824 are responsible for controlling or interfacing with the underlying hardware, according to some embodiments. For instance, the drivers 824 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 806 provide a low-level common infrastructure utilized by the applications 810. The libraries 806 can include system libraries 830 such as libraries of blocks for use in an EDA environment or other libraries that can provide functions such as memory allocation functions, string manipulation functions, mathematic functions, and the like. In addition, the libraries 806 can include API libraries 832 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in two dimensions (2D) and three dimensions (3D) in a graphic context on a display), database libraries (e.g., SQLite to provide various relational database functions), web libraries (e.g., WebKit to provide web browsing functionality), and the like. The libraries 806 may also include other libraries 834.

The software frameworks 808 provide a high-level common infrastructure that can be utilized by the applications 810, according to some embodiments. For example, the software frameworks 808 provide various graphic user interface (GUI) functions, high-level resource management, high-level location services, and so forth. The software frameworks 808 can provide a broad spectrum of other APIs that can be utilized by the applications 810, some of which may be specific to a particular operating system 804 or platform. In various embodiments, the systems, methods, devices, and instructions described herein may use various files, macros, libraries, and other elements of an EDA design environment to implement routing capacity adjustment based on detected regions as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 802, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 900 including processors 910), with these operations being accessible via a network (e.g., the Internet) and via one or more appropriate interfaces (e.g., an API). In certain embodiments, for example, a client device may relay or operate in communication with cloud computing systems, and may access circuit design information in a cloud environment.

The performance of certain of the operations may be distributed among the processors, not only residing within a single machine 900, but deployed across a number of machines 900. In some embodiments, the processors 910 or processor-implemented modules are located in a single geographic location (e.g., within a home environment, an office environment, or a server farm). In some other embodiments, the processors or processor-implemented modules are distributed across a number of geographic locations.

Figure 9:
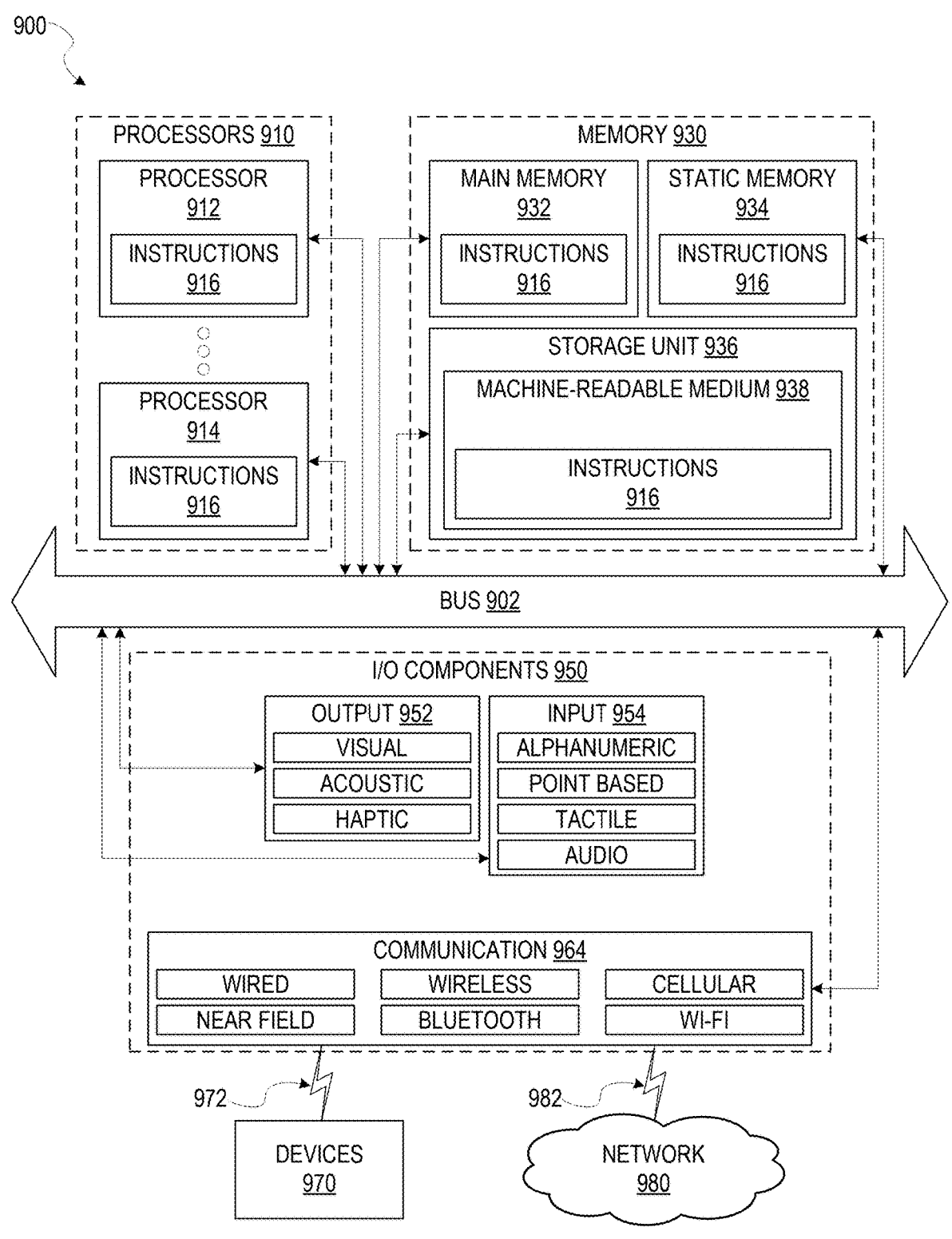
FIG. 9 is a diagram representing a machine in the form of a computer system within which a set of instructions are executed, causing the machine to perform any one or more of the methods discussed herein, according to some embodiments.

FIG. 9 is a diagrammatic representation of the machine 900 in the form of a computer system within which a set of instructions may be executed for causing the machine 900 to perform any one or more of the methodologies discussed herein, according to some embodiments. FIG. 9 shows components of the machine 900, which is, according to some embodiments, able to read instructions from a machine-readable medium (e.g., a machine-readable storage medium) and perform any one or more of the methodologies discussed herein. Specifically, FIG. 9 shows a diagrammatic representation of the machine 900 in the example form of a computer system, within which instructions 916 (e.g., software, a program, an application, an applet, an app, or other executable code) for causing the machine 900 to perform any one or more of the methodologies discussed herein can be executed. In alternative embodiments, the machine 900 operates as a standalone device or can be coupled (e.g., networked) to other machines. In a networked deployment, the machine 900 may operate in the capacity of a server machine or a client machine in a server-client network environment, or as a peer machine in a peer-to-peer (or distributed) network environment. The machine 900 can comprise, but not be limited to, a server computer, a client computer, a personal computer (PC), a tablet computer, a laptop computer, a netbook, or any machine capable of executing the instructions 916, sequentially or otherwise, that specify actions to be taken by the machine 900. Further, while only a single machine 900 is illustrated, the term "machine" shall also be taken to include a collection of machines 900 that individually or jointly execute the instructions 916 to perform any one or more of the methodologies discussed herein.

In various embodiments, the machine 900 comprises processors 910, memory 930, and I/O components 950, which can be configured to communicate with each other via a bus 902. In some embodiments, the processors 910 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 912 and a processor 914 that may execute the instructions 916. The term "processor" is intended to include multi-core processors 910 that may comprise two or more independent processors 912, 914 (also referred to as "cores") that can execute the instructions 916 contemporaneously. Although FIG. 9 shows multiple processors 910, the machine 900 may include a single processor 912 with a single core, a single processor 912 with multiple cores (e.g., a multi-core processor 912), multiple processors 910 with a single core, multiple processors 910 with multiple cores, or any combination thereof.

The memory 930 comprises a main memory 932, a static memory 934, and a storage unit 936 accessible to the processors 910 via the bus 902, according to some embodiments. The storage unit 936 can include a machine-readable medium 938 on which are stored the instructions 916 embodying any one or more of the methodologies or functions described herein. The instructions 916 can also reside, completely or at least partially, within the main memory 932, within the static memory 934, within at least one of the processors 910 (e.g., within the processor's cache memory), or any suitable combination thereof, during execution thereof by the machine 900. Accordingly, in various embodiments, the main memory 932, the static memory 934, and the processors 910 are considered machine-readable media 938.

As used herein, the term "memory" refers to a machine-readable medium 938 able to store data temporarily or permanently and may be taken to include, but not be limited to, random-access memory (RAM), read-only memory (ROM), buffer memory, flash memory, and cache memory. While the machine-readable medium 938 is shown, in some embodiments, to be a single medium, the term "machine-readable medium" should be taken to include a single medium or multiple media (e.g., a centralized or distributed database, or associated caches and servers) able to store the instructions 916. The term "machine-readable medium" shall also be taken to include any medium, or combination of multiple media, that is capable of storing instructions (e.g., the instructions 916) for execution by a machine (e.g., the machine 900), such that the instructions, when executed by one or more processors of the machine (e.g., the processors 910), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 950 include a wide variety of components to receive input, provide output, produce output, transmit information, exchange information, capture measurements, and so on. In general, it will be appreciated that the I/O components 950 can include many other components that are not shown in FIG. 9. The I/O components 950 are grouped according to functionality merely for simplifying the following discussion, and the grouping is in no way limiting. In various embodiments, the I/O components 950 include output components 952 and input components 954. The output components 952 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 954 include alphanumeric input components (e.g., a keyboard, a touch screen configured to receive alphanumeric input, a photo-optical keyboard, or other alphanumeric input components), point-based input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 950 may include communication components 964 operable to couple the machine 900 to a network 980 or devices 970 via a coupling 982 and a coupling 972, respectively. For example, the communication components 964 include a network interface component or another suitable device to interface with the network 980. In further examples, the communication components 964 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 970 may be another machine or any of a wide variety of peripheral devices (e.g., a peripheral device coupled via a USB).

In various embodiments, one or more portions of the network 980 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 980 or a portion of the network 980 may include a wireless or cellular network, and the coupling 982 may be a Code Division Multiple Access (CDMA) connection, a Global System for Mobile communications (GSM) connection, or another type of cellular or wireless coupling.

Furthermore, the machine-readable medium 938 is non-transitory (in other words, not having any transitory signals) in that it does not embody a propagating signal. However, labeling the machine-readable medium 938 "non-transitory" should not be construed to mean that the machine-readable medium 938 is incapable of movement; the machine-readable medium 938 should be considered as being transportable from one physical location to another. Additionally, since the machine-readable medium 938 is tangible, the machine-readable medium 938 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A non-transitory computer-readable medium comprising instructions that, when executed by a hardware processor of a device, cause the device to perform operations comprising:

accessing circuit data that describes a set of shapes of a circuit design, a set of input/output (I/O) pins of the circuit design, and a set of grid cells of one or more layers of the circuit design, a global routing process dividing the one or more layers of the circuit design into the set of grid cells to route one or more nets of the circuit design;

determining a set of notch regions of the circuit design based on a set of shapes, each notch region comprising at least one of a concave corner of a boundary of the circuit design or a corner of a layout of a macro within the circuit design;

determining a set of I/O pin regions of the circuit design based on the set of I/O pins; and adjusting a routing capacity of a select grid cell in the set of grid cells based on at least one of the set of notch regions or the set of I/O pin regions.

2. The non-transitory computer-readable medium of claim 1, wherein the determining of the set of notch regions based on the set of shapes comprises:

scanning the set of grid cells using a grid cell window having a predetermined dimension; and during the scanning:

detecting, based on the set of shapes, whether a current region of the circuit design within the grid cell window satisfies a notch region detection condition; and in response to the notch region detection condition being satisfied by the current region, adding the current region to the set of notch regions.

3. The non-transitory computer-readable medium of claim 2, wherein the predetermined dimension of the grid cell window is two grid cells by two grid cells.

4. The non-transitory computer-readable medium of claim 2, wherein the notch region detection condition comprises at least one grid cell of the grid cell window lying outside of a select shape of the set of shapes.

5. The non-transitory computer-readable medium of claim 2, wherein the notch region detection condition comprises at least one grid cell of the grid cell window lying inside of a select shape of the set of shapes, and wherein the select shape is a macro.

6. The non-transitory computer-readable medium of claim 1, wherein the determining of the set of I/O pin regions based on the set of I/O pins comprises:

determining an initial subset of the set of grid cells that comprise at least one of the set of I/O pins;

determining, from the initial subset of grid cells, a select subset of grid cells where each grid cell has a pin count greater than a pin count threshold value; and determining one or more groupings of adjacent grid cells within the select subset of grid cells, each individual grouping forming an individual I/O pin region in the set of I/O pin regions.

7. The non-transitory computer-readable medium of claim 6, wherein the individual grouping comprises vertically adjacent grid cells that each include vertical pins.

8. The non-transitory computer-readable medium of claim 6, wherein the individual grouping comprises horizontally adjacent grid cells that each include horizontal pins.

9. The non-transitory computer-readable medium of claim 1, wherein the adjusting of the routing capacity of the select grid cell based on at least one of the set of notch regions or the set of I/O pin regions comprises:

for an individual region of one of the set of notch regions or the set of I/O pin regions, updating routing capacities of one or more grid cells of the set of grid cells within the individual region based on a routing capacity adjustment scale value.

10. The non-transitory computer-readable medium of claim 1, wherein the adjusting of the routing capacity of the select grid cell based on at least one of the set of notch regions or the set of I/O pin regions comprises:

based on a region expansion scale value, expanding each individual region, in the set of notch regions and the set of I/O pin regions, to include grid cells neighboring the individual region.

11. The non-transitory computer-readable medium of claim 1, wherein the adjusting of the routing capacity of the select grid cell based on at least one of the set of notch regions or the set of I/O pin regions comprises:

for an individual region of one of the set of notch regions or the set of I/O pin regions, updating routing capacities of one or more grid cells of the set of grid cells that neighbor the individual region based on respective distances from the individual region.

12. A method comprising:

accessing, by a hardware processor, circuit data that describes a set of shapes of a circuit design, a set of input/output (I/O) pins of the circuit design, and a set of grid cells of one or more layers of the circuit design, a global routing process dividing the one or more layers of the circuit design into the set of grid cells to route one or more nets of the circuit design;

determining, by the hardware processor, a set of notch regions of the circuit design based on the set of shapes, each notch region comprising at least one of a concave corner of a boundary of the circuit design or a corner of a layout of a macro within the circuit design;

determining, by the hardware processor, a set of I/O pin regions of the circuit design based on the set of I/O pins; and adjusting, by the hardware processor, a routing capacity of a select grid cell in the set of grid cells based on at least one of the set of notch regions or the set of I/O pin regions.

13. The method of claim 12, wherein the determining of the set of notch regions based on the set of shapes comprises:

scanning the set of grid cells using a grid cell window having a predetermined dimension; and during the scanning:

detecting, based on the set of shapes, whether a current region of the circuit design within the grid cell window satisfies a notch region detection condition; and in response to the notch region detection condition being satisfied by the current region, adding the current region to the set of notch regions.

14. The method of claim 12, wherein the determining of the set of I/O pin regions based on the set of I/O pins comprises:

determining an initial subset of the set of grid cells that comprise at least one of the set of I/O pins;

determining, from the initial subset of grid cells, a select subset of grid cells where each grid cell has a pin count greater than a pin count threshold value; and determining one or more groupings of adjacent grid cells within the select subset of grid cells, each individual grouping forming an individual I/O pin region in the set of I/O pin regions.

15. The method of claim 12, wherein the adjusting of the routing capacity of the select grid cell based on at least one of the set of notch regions or the set of I/O pin regions comprises:

for an individual region of one of the set of notch regions or the set of I/O pin regions, updating routing capacities of one or more grid cells of the set of grid cells within the individual region based on a routing capacity adjustment scale value.

16. The method of claim 12, wherein the adjusting of the routing capacity of the select grid cell based on at least one of the set of notch regions or the set of I/O pin regions comprises:

based on a region expansion scale value, expanding each individual region, in the set of notch regions and the set of I/O pin regions, to include grid cells neighboring the individual region.

17. The method of claim 12, wherein the adjusting of the routing capacity of the select grid cell based on at least one of the set of notch regions or the set of I/O pin regions comprises:

for an individual region of one of the set of notch regions or the set of I/O pin regions, updating routing capacities of one or more grid cells of the set of grid cells that neighbor the individual region based on respective distances from the individual region.

18. A device comprising:

a memory storing instructions; and a hardware processor communicatively coupled to the memory and configured by the instructions to perform operations comprising:

determining a set of notch regions of a circuit design based on a set of shapes of the circuit design, each notch region comprising at least one of a concave corner of a boundary of the circuit design or a corner of a layout of a macro within the circuit design;

determining a set of input/output (I/O) pin regions of the circuit design based on a set of I/O pins of the circuit design; and adjusting a routing capacity of a select grid cell in a set of grid cells based on at least one of the set of notch regions or the set of I/O pin regions.

19. The device of claim 18, wherein the determining of the set of notch regions based on the set of shapes comprises:

scanning the set of grid cells using a grid cell window having a predetermined dimension; and during the scanning:

detecting, based on the set of shapes, whether a current region of the circuit design within the grid cell window satisfies a notch region detection condition; and in response to the notch region detection condition being satisfied by the current region, adding the current region to the set of notch regions.

20. The device of claim 18, wherein the determining of the set of IO pin regions based on the set of I/O pins comprises:

determining an initial subset of the set of grid cells that comprise at least one of the set of I/O pins;

determining, from the initial subset of grid cells, a select subset of grid cells where each grid cell has a pin count greater than a pin count threshold value; and determining one or more groupings of adjacent grid cells within the select subset of grid cells, each individual grouping forming an individual I/O pin region in the set of I/O pin regions.

\* \* \* \* \*